United States Patent
Yang

(10) Patent No.: US 11,295,964 B2
(45) Date of Patent: Apr. 5, 2022

(54) PRESSURE REGULATING DEVICE AND SEMICONDUCTOR PRODUCTION SYSTEM

(71) Applicant: GENES TECH CO., LTD., Zhubei (TW)

(72) Inventor: Ming-Hsiang Yang, Zhubei (TW)

(73) Assignee: GENES TECH CO., LTD., Zhubei (TW)

( * ) Notice: Subject to any disclaimer, the term of this patent is extended or adjusted under 35 U.S.C. 154(b) by 289 days.

(21) Appl. No.: 16/726,697

(22) Filed: Dec. 24, 2019

(65) Prior Publication Data

US 2021/0143025 A1 May 13, 2021

(30) Foreign Application Priority Data

Nov. 11, 2019 (TW) .................. 108140885

(51) Int. Cl.
| | | |
|---|---|---|
| *H01L 21/67* | (2006.01) | |
| *F04B 49/08* | (2006.01) | |
| *F04B 49/06* | (2006.01) | |
| *F04B 49/10* | (2006.01) | |
| *F04B 49/20* | (2006.01) | |

(52) U.S. Cl.
CPC ...... *H01L 21/67017* (2013.01); *F04B 49/065* (2013.01); *F04B 49/08* (2013.01); *F04B 49/10* (2013.01); *F04B 49/20* (2013.01); *F04B 2205/01* (2013.01)

(58) Field of Classification Search
CPC ........ F04B 49/065; F04B 49/08; F04B 49/10; F04B 49/20; F04B 2205/02; F04B 2205/06; H01L 21/67017
See application file for complete search history.

(56) References Cited

U.S. PATENT DOCUMENTS

| | | | | |
|---|---|---|---|---|
| 5,464,327 A | * | 11/1995 | Horwitz | E03B 5/02 417/12 |
| 6,568,426 B1 | * | 5/2003 | Chapman | F04B 49/02 137/335 |
| 9,611,627 B2 | * | 4/2017 | Schreiner | E03B 7/07 |
| 2006/0094337 A1 | * | 5/2006 | Lee | B24B 53/017 451/5 |
| 2007/0089853 A1 | * | 4/2007 | Nomoto | G03F 7/70858 165/65 |
| 2016/0218026 A1 | * | 7/2016 | Kobayashi | H01L 21/67253 |

* cited by examiner

*Primary Examiner* — Patrick Hamo
(74) *Attorney, Agent, or Firm* — Muncy, Geissler, Olds & Lowe, P.C.

(57) ABSTRACT

A pressure regulating device cooperates with a semiconductor production system to regulate a pressure in a pipe of a semiconductor production apparatus in the semiconductor production system. The pressure regulating device reduces the pressure in the pipe of the semiconductor apparatus by a suction pump to prevent from liquid leakage when the pipe is broken. In addition, the pressure regulating device can periodically record the pressure change in the pipe to facilitate an operator to judge whether the pipe is damaged and analyze the cause of decrease in production yield.

18 Claims, 2 Drawing Sheets

PRESSURE REGULATING DEVICE AND SEMICONDUCTOR PRODUCTION SYSTEM

BACKGROUND OF THE INVENTION

1. Field of the Invention

The present invention relates to a pressure regulating device and a semiconductor production system, particularly to a pressure regulating device able to regulate the pressure in a pipe of a semiconductor production apparatus and the semiconductor production system thereof.

2. Description of the Prior Art

The dimensions of semiconductor elements are being decreased persistently, and the demand to the parameters of a semiconductor production process become more and more strict. Temperature, such as the temperature of a semiconductor production apparatus or the temperature of a chemical agent, is an important parameter in semiconductor production. In order to precisely control the temperature parameters, a liquid having a specified temperature is passed through a semiconductor production apparatus or a chemical agent to maintain the stability of the temperature of the semiconductor production apparatus or the chemical agent. However, the pipe transporting the liquid having a specified temperature may be broken, and the liquid may thus leak out. Liquid leakage may cause pollution of semiconductor elements and result in decrease of production yield. At present, pipe breakage still lacks an appropriate monitoring measure, and the operators are still unlikely to find out the cause of yield decrease in a systematic method.

Accordingly, the manufactures are eager to develop a device able to find out liquid leakage, inform operators of the liquid leakage, and prevent semiconductor elements from being polluted by the liquid leakage.

SUMMARY OF THE INVENTION

The present invention provides a pressure regulating device and a semiconductor production system, wherein a suction pump is used to reduce the pressure of the operation area of a semiconductor production apparatus to prevent liquid from leaking out of a broken pipe, and wherein the pressure change of the pipe is recorded to facilitate operators to analyze the cause of decrease in production yield and solve the problem.

In one embodiment of the present invention, a pressure regulating device cooperates with a semiconductor production system, regulating the pressure in a pipe of a semiconductor production apparatus of the semiconductor production system. The semiconductor production system comprises a liquid supply source, which is connected with the pipe to supply a liquid to the semiconductor production apparatus. The pressure regulating device comprises a suction pump, a pressure sensor, a storage unit and a control unit. The suction pump is disposed in the downstream of the semiconductor production apparatus and connected with the pipe, sucking the liquid inside the pipe. The pressure sensor is disposed between the semiconductor production apparatus and the suction pump, detecting a pressure value of the pipe between the semiconductor production apparatus and the suction pump. The storage unit stores the pressure value detected by the pressure sensor. The control unit is electrically connected with the suction pump, the pressure sensor, the storage unit and the liquid supply source. The control unit controls the rotation speed of the suction pump to regulate the pressure inside the pipe. The control unit periodically records the pressure values detected by the pressure sensor and corresponding time stamps in the storage unit. The control unit modifies a liquid output amount of the liquid supply source and generates a corresponding alert signal when the pressure value detected by the pressure sensor is abnormal.

In another embodiment of the present invention, the semiconductor production system comprises a semiconductor production apparatus, a liquid supply source and a pressure regulating device. The semiconductor production apparatus includes an operation area where a semiconductor production process is undertaken. The liquid supply source is connected with the semiconductor production apparatus through a pipe and supplies a liquid through the pipe to pass the operation area of the semiconductor production apparatus. The pressure regulating device includes a suction pump, a pressure sensor, a storage unit and a control unit. The suction pump is disposed in the downstream of the semiconductor production apparatus and connected with the pipe, sucking the liquid inside the pipe. The pressure sensor is disposed between the semiconductor production apparatus and the suction pump, detecting a pressure value of the pipe between the semiconductor production apparatus and the suction pump. The storage unit stores the pressure values detected by the pressure sensor. The control unit is electrically connected with the suction pump, the pressure sensor, the storage unit and the liquid supply source. The control unit controls the rotation speed of the suction pump to regulate the pressure inside the pipe. The control unit periodically records the pressure values detected by the pressure sensor and corresponding time stamps in the storage unit. The control unit modifies a liquid output amount of the liquid supply source and generates a corresponding alert signal when the pressure value detected by the pressure sensor is abnormal.

Below, embodiments are described in detail in cooperation with the attached drawings to make easily understood the objectives, technical contents, characteristics and accomplishments of the present invention.

BRIEF DESCRIPTION OF THE DRAWINGS

The foregoing conceptions and their accompanying advantages of this invention will become more readily appreciated after being better understood by referring to the following detailed description, in conjunction with the accompanying drawings, wherein.

DESCRIPTION OF THE PREFERRED EMBODIMENTS

Various embodiments of the present invention will be described in detail below and illustrated in conjunction with the accompanying drawings. In addition to these detailed descriptions, the present invention can be widely implemented in other embodiments, and apparent alternations, modifications and equivalent changes of any mentioned embodiments are all included within the scope of the present invention and based on the scope of the Claims. In the descriptions of the specification, in order to make readers have a more complete understanding about the present invention, many specific details are provided; however, the present invention may be implemented without parts of or all the specific details. In addition, the well-known steps or elements are not described in detail, in order to avoid unnecessary limitations to the present invention. Same or similar elements in Figures will be indicated by same or similar reference numbers. It is noted that the Figures are schematic and may not represent the actual size or number of the elements. For clearness of the Figures, some details may not be fully depicted.

Figure 1:
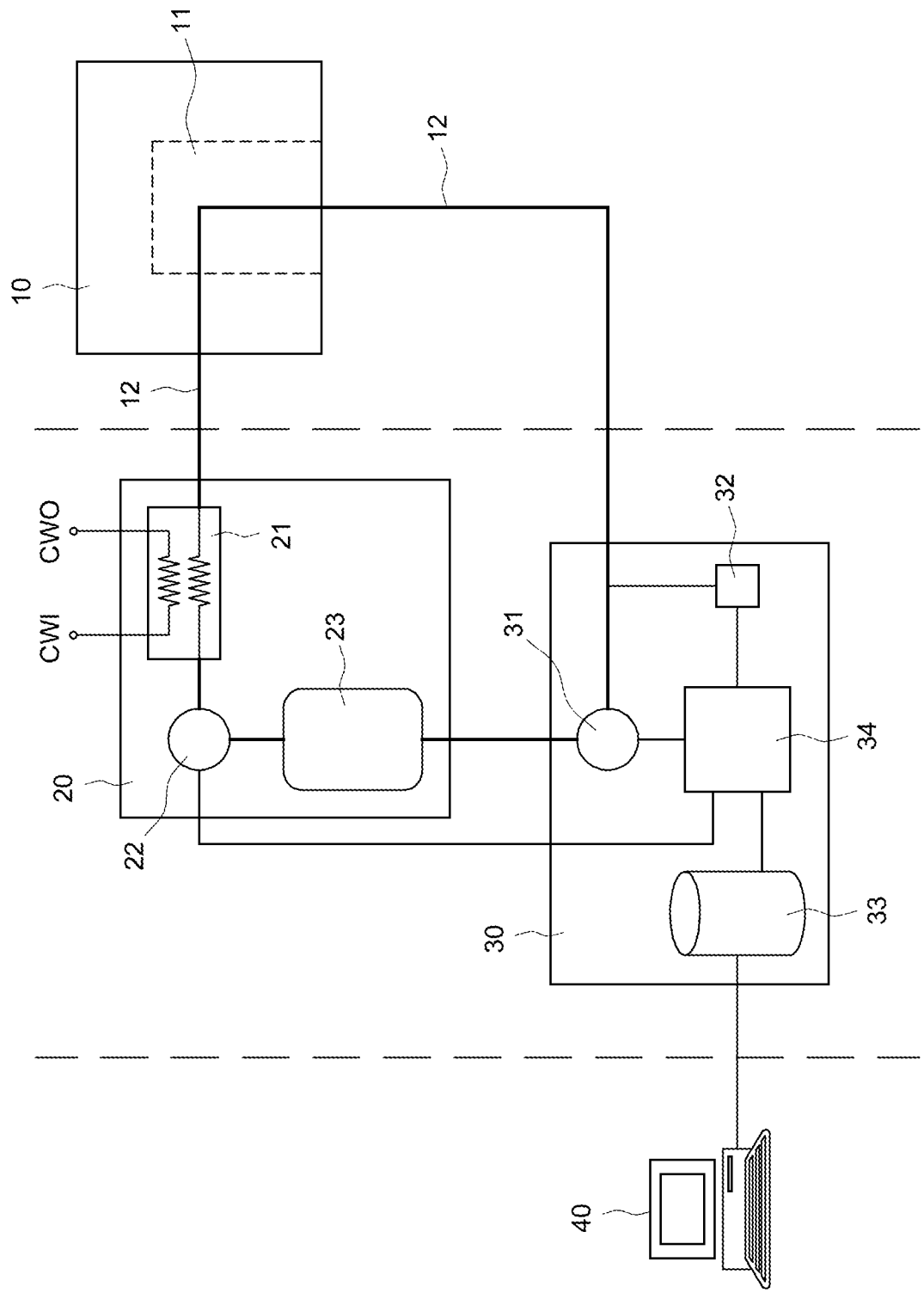
FIG. 1 is a diagram schematically a semiconductor production system and a pressure regulating device according to one embodiment of the present invention.

In one embodiment of the present invention, a pressure regulating device cooperates with a semiconductor production system, regulating the pressure in a pipe of a semiconductor production apparatus of the semiconductor production system. Refer to FIG. 1. The semiconductor production system comprises a semiconductor production apparatus 10 and a liquid supply source 20. The semiconductor production apparatus 10 includes an operation area 11 where the semiconductor production processes, including exposure, development and etching, are undertaken. The liquid supply source 20 is connected with the semiconductor production apparatus 10 through a pipe 12. The liquid supplied by the liquid supply source 20 is sent through the pipe 12 to pass the operation area 11 of the semiconductor production apparatus 10. For example, the liquid supply source 20 supplies a liquid having a given temperature to stabilize the operation temperature of the operation area 11 or the temperature of a chemical agent.

In one embodiment of the present invention, the liquid supply source 20 further comprises a heat exchanger 21, an output pump 22 and a liquid storage tank 23. The output pump 22 is disposed between the liquid storage tank 23 and the heat exchanger 21 to drive the liquid from the liquid storage tank 23 to the heat exchanger 21 for heat exchange. For example, the heat exchanger 21 includes a cooling water inlet CWI and a cooling water outlet CWO. The liquid entering the heat exchanger 21 undertakes heat exchange with cooling water, whereby the liquid is controlled to a predetermined temperature and then output to the semiconductor production apparatus 10.

The pressure regulating device 30 comprises a suction pump 31, a pressure sensor 32, a storage unit 33 and a control unit 34. The suction pump 31 is disposed in the downstream of the semiconductor production apparatus 10 and connected with the pipe 12, i.e. connected with the output end of the pipe 12 that has travelled through the semiconductor production apparatus 10, whereby to suck the liquid inside the pipe 12. In one embodiment, the liquid sucked by the suction pump 31 flows back to the liquid storage tank 23; the liquid in the liquid storage tank 23 is sent to the heat exchanger 21 by the output pump 22 for heat exchange and then output to the semiconductor production apparatus 10, whereby is formed a closed circulation pipe.

The pressure sensor 32 is disposed between the semiconductor production apparatus 10 and the suction pump 31, detecting a pressure value of the pipe 12 between the semiconductor production apparatus 10 and the suction pump 31. The control unit 34 is electrically connected with the suction pump 31, the pressure sensor 32, the storage unit 33 and the liquid supply source 20. The control unit 34 controls the rotation speed of the suction pump 31 to regulate the pressure inside the pipe 12. The control unit 34 also periodically records the pressure value of the pipe 12, which is detected by the pressure sensor 32, and a corresponding time stamp in the storage unit 33. Besides, the control unit 34 modifies the amount of the liquid output by the liquid supply source 20 and generates a corresponding alert signal when an abnormal pressure value, such as a pressure value lower than a specified value, is detected.

Based on the abovementioned structure, the pressure regulating device 30 of the present invention can regulate the pressure inside the pipe 12, especially the pressure of the pipe section in the operation area 11, lest breakage of the pipe 12 cause liquid leakage and pollute semiconductor elements in the production process. For example, the control unit 34 controls the suction amount of the suction pump 31 to be larger than the liquid output amount of the liquid supply source 20 so as to decrease the pressure inside the pipe 12. In one embodiment, the pressure inside the pipe 12 is lower than the pressure outside the pipe 12; while a breakage occurs in the pipe 12, the liquid inside the pipe 12 will be sucked back to the liquid storage tank 23 by the suction pump 31 of the pressure regulating device 30, exempted from leaking out of the pipe 12.

Besides, the pressure values, which are detected by the pressure sensor 32 and periodically recorded, may be used to judge whether the pipe 12 leaks. For example, while the pressure value detected by the pressure sensor 32 is smaller than a specified value, the control unit 34 will determine that the pipe 12 is broken and that leakage occurs. In such a case, the control unit 34 may stop the operation of the output pump 22, i.e. stop the output action of the liquid supply source 20, and generate an alert signal to remind the operator to take an appropriate action. In one embodiment, the semiconductor production system comprises a Computer-Integrating Manufacturing (CIM) system 40. The CIM system 40 is electrically connected with the storage unit 33, retrieving the pressure values and corresponding time stamps, which are stored in the storage unit 33, for error detection and process improvement. For example, the CIM system 40 may retrieve the storage unit 33 through the control unit 34 or retrieve the storage unit 33 through an appropriate Application Programming Interface (API). The CIM system has been well known by the persons skilled in the art and thus will not repeat herein.

Refer to FIG. 1 again. In one embodiment, the semiconductor production apparatus 10, the liquid supply source 20, the pressure regulating device 30 are separated from each other in space. For example, semiconductor production apparatus 10 may be disposed in a space having higher cleanness; the liquid supply source 20 and the pressure regulating device 30 may be disposed in a space having lower cleanness or disposed in a different floor. It is easily understood: the CIM system 40 may be disposed in a space where the operators can conveniently operate the system.

Figure 2:
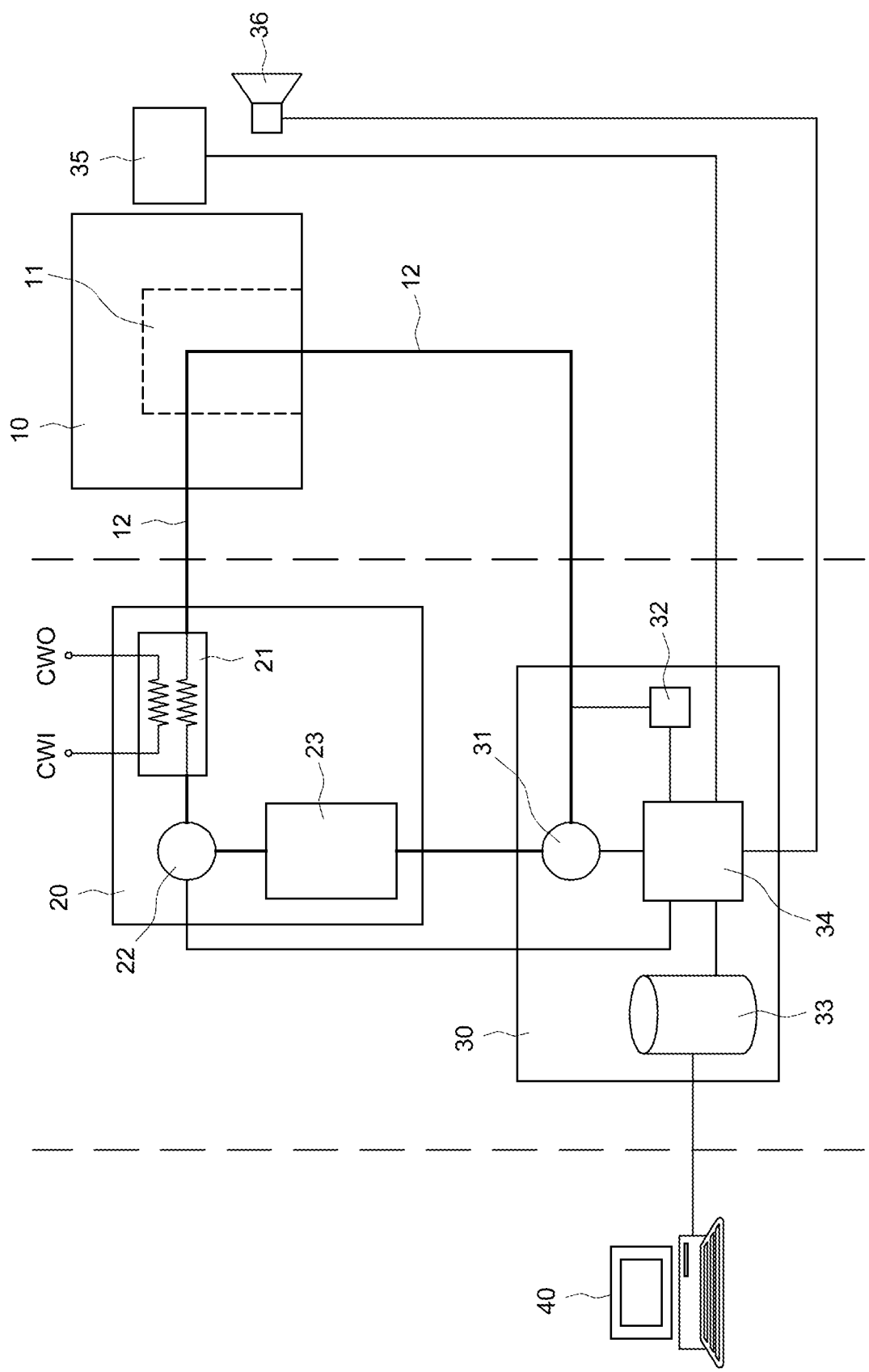
FIG. 2 is a diagram schematically a semiconductor production system and a pressure regulating device according to another embodiment of the present invention.

Refer to FIG. 2. In one embodiment, the pressure regulating device 30 of the present invention further comprises a display panel 35, which is electrically connected with the control unit 34 and used to display the pressure values detected by the pressure sensor 32 and present the alert signal. As mentioned above, the pressure regulating device 30 and the semiconductor production apparatus 10 may be disposed apart from each other in space. In one embodiment, the display panel 35 is disposed at an end of the semiconductor production apparatus 10. In other words, the display panel 35 neighbors the semiconductor production apparatus 10. Thus, while the operator is operating the semiconductor production apparatus 10, he can also learn the pressure variation of the pipe 12 and whether the pipe 12 leaks via the display panel 35 of the pressure regulating device 30. In one embodiment, the display panel 35 is a touchscreen, which conveniences the operator to operate the system or set the pressure regulating device 30.

In one embodiment, the pressure regulating device 30 of the present invention further comprises an alert unit 36. The alert unit 36 is electrically connected with the control unit 34, converting an electric alert signal, which is output by the control unit 34, into a signal recognizable to the operators. For example, the alert unit 36 may be a buzzer or an alert light. In order to effectively alarm the operators, the alert unit 36 may be disposed at the end of the semiconductor production apparatus 10. In other words, the alert unit 36 neighbors the semiconductor production apparatus 10.

In one embodiment, the alert signals output by the pressure regulating device 30 include a first sub-alert signal and a second sub-alert signal, which are respectively corresponding to different pressure ranges of the pipe 12. For example, according to the past production experience, while the pressure value detected by the pressure sensor 32 is smaller than a first predetermined value, it indicates that the pipe 12 may have an instable pressure or suffer a slight breakage and that the production process is not affected. In other words, the pressure variation in the pipe 12 is acceptable. In such a case, it is allowed: the pressure regulating device 30 does not stop the output pump 22 of the liquid supply source 20 until the batch-type production process is completed. The interruption of the production process may bring about a larger loss. In this case, the pressure regulating device 30 may output the first sub-alert signal, such as a yellow alert light or an alert sound with a smaller volume, to indicate to the operators that the pressure of the pipe 12 is lowered but the production process is not affected. While the pressure value detected by the pressure sensor 32 is further lowered and smaller than a second predetermined value, it indicates that the breakage of the pipe 12 is severe and will affect the production process instantly. In such a case, the pressure regulating device 30 should stop the production process at once; for example, the pressure regulating device 30 stops the output pump 22 of the liquid supply source 20 to avoid a larger loss. In this case, the pressure regulating device 30 may output the second sub-alert signal, such as a red alert light or an alert sound with a larger volume, to indicate that the operators should undertake an appropriate measure, such as repairing the pipe 12.

In conclusion, the present invention provides a pressure regulating device and a semiconductor production system, wherein a suction pump is used to reduce the pressure of the operation area of a semiconductor production apparatus to prevent from liquid leaking when a pipe is broken. Besides, the pressure regulating device periodically records the pressure change of the pipe. The operators can judge whether the pipe is broken and analyze the cause of decrease in production yield according to the data of pressure variation, whereby the production process can be improved.

The embodiments have been described above to demonstrate the technical thoughts and characteristics of the present invention to make the persons skilled in the art to understand, make, and use the present invention. However, these embodiments are not intended to limit the scope of the present invention. Any equivalent modification or variation according to the spirit of the present invention is to be also included by the scope of the present invention.

What is claimed is:

1. A pressure regulating device, cooperating with a semiconductor production system to regulate a pressure in a pipe of a semiconductor production apparatus of the semiconductor production system, wherein the semiconductor production system comprises a liquid supply source, which is connected with the pipe to supply a liquid to the semiconductor production apparatus, and wherein the pressure regulating device comprises:
    a suction pump configured to be disposed in a downstream of the semiconductor production apparatus, for connecting with the pipe and sucking liquid inside the pipe;
    a pressure sensor configured to be disposed between the semiconductor production apparatus and the suction pump, for detecting a pressure value of the pipe between the semiconductor production apparatus and the suction pump;
    a storage unit, storing the pressure value detected by the pressure sensor; and
    a control unit, electrically connected with the suction pump, the pressure sensor, the storage unit and the liquid supply source, controlling a rotation speed of the suction pump to regulate the pressure inside the pipe, periodically recording the pressure values detected by the pressure sensor and corresponding time stamps in the storage unit, and modifying a liquid output amount of the liquid supply source and generating a corresponding alert signal when the pressure value detected by the pressure sensor is abnormal.

2. The pressure regulating device according to claim 1, wherein the storage unit is electrically connected with a Computer-Integrating Manufacturing (CIM) system and allows the CIM system to retrieve the pressure values detected by the pressure sensor and the corresponding time stamps.

3. The pressure regulating device according to claim 1, wherein the pipe is a closed circulation pipe.

4. The pressure regulating device according to claim 1, wherein a position where the semiconductor production apparatus is disposed and a position where the pressure regulating device is disposed are separated from each other in space.

5. The pressure regulating device according to claim 1 further comprising:
    a display panel, which is disposed at an end of the semiconductor production apparatus and electrically connected with the control unit, and used to display the pressure values detected by the pressure sensor and present the alert signal.

6. The pressure regulating device according to claim 5, wherein the display panel is a touchscreen.

7. The pressure regulating device according to claim 1 further comprising:
    an alert unit, which is disposed at an end of the semiconductor production apparatus, electrically connected with the control unit, and generating the alert signal, which is recognizable to operators.

8. The pressure regulating device according to claim 1, wherein the alert signal is a first sub-alert signal or a second sub-alert signal, and wherein the first sub-alert signal indicates that the pressure value is smaller than a first predetermined value, and wherein the second sub-alert signal indicates that the pressure value is smaller than a second predetermined value, and wherein the second predetermined value is smaller than the first predetermined value.

9. A semiconductor production system comprising:
    a semiconductor production apparatus, including an operation area where a semiconductor production process is undertaken;
    a liquid supply source, connected with the semiconductor production apparatus through a pipe, and supplying a liquid through the pipe to pass the operation area of the semiconductor production apparatus; and a pressure regulating device, comprising:
- a suction pump, disposed in a downstream of the semiconductor production apparatus, connected with the pipe, and sucking the liquid inside the pipe;
- a pressure sensor, disposed between the semiconductor production apparatus and the suction pump, and detecting a pressure value of the pipe between the semiconductor production apparatus and the suction pump;
- a storage unit, storing the pressure values detected by the pressure sensor; and
- a control unit, electrically connected with the suction pump, the pressure sensor, the storage unit and the liquid supply source, controlling a rotation speed of the suction pump to regulate a pressure inside the pipe, periodically recording the pressure values detected by the pressure sensor and corresponding time stamps in the storage unit, and modifying a liquid output amount of the liquid supply source and generating a corresponding alert signal when the pressure value detected by the pressure sensor is abnormal.

10. The semiconductor production system according to claim 9 further comprising:
- a Computer-Integrating Manufacturing (CIM) system, electrically connected with the storage unit to retrieve the pressure values detected by the pressure sensor and the corresponding time stamps.

11. The semiconductor production system according to claim 9, wherein a position where the semiconductor production apparatus is disposed and a position where the pressure regulating device is disposed are separated from each other in space.

12. The semiconductor production system according to claim 9, wherein the pressure regulating device further comprises a display panel, which is disposed at an end of the semiconductor production apparatus, electrically connected with the control unit, and used to display the pressure values detected by the pressure sensor and present the alert signal.

13. The semiconductor production system according to claim 12, wherein the display panel is a touchscreen.

14. The semiconductor production system according to claim 9, wherein the pressure regulating device further comprises an alert unit, which is disposed at an end of the semiconductor production apparatus, electrically connected with the control unit, and generating the alert signal, which is recognizable to operators.

15. The semiconductor production system according to claim 9, wherein the alert signal is a first sub-alert signal or a second sub-alert signal, and wherein the first sub-alert signal indicates that the pressure value is smaller than a first predetermined value, and wherein the second sub-alert signal indicates that the pressure value is smaller than a second predetermined value, and wherein the second predetermined value is smaller than the first predetermined value.

16. The semiconductor production system according to claim 9, wherein the pipe is a closed circulation pipe.

17. The semiconductor production system according to claim 9, wherein the liquid supply source further comprises:
- a heat exchanger, used to control the liquid to a specified temperature;
- a liquid storage tank, connected with the pressure regulating device and the heat exchanger, and receiving the liquid sucked by the pressure regulating device; and
- an output pump, disposed between the liquid storage tank and the heat exchanger, driving the liquid to the heat exchanger for heat exchange, and then outputting the liquid to the semiconductor production apparatus.

18. The semiconductor production system according to claim 9, wherein a position where the semiconductor production apparatus is disposed and a position where the liquid supply source is disposed are separated from each other in space.

* * * * *